(12) United States Patent
Dittmar et al.

(10) Patent No.: US 7,396,749 B2
(45) Date of Patent: Jul. 8, 2008

(54) METHOD FOR CONTACTING PARTS OF A COMPONENT INTEGRATED INTO A SEMICONDUCTOR SUBSTRATE

(75) Inventors: Ludwig Dittmar, Dresden (DE); Wolfgang Gustin, Dresden (DE); Maik Stegemann, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/519,741

(22) PCT Filed: Jun. 24, 2003

(86) PCT No.: PCT/DE03/02104

§ 371 (c)(1),
(2), (4) Date: Nov. 4, 2005

(87) PCT Pub. No.: WO2004/003998

PCT Pub. Date: Jan. 8, 2004

(65) Prior Publication Data

US 2006/0094217 A1    May 4, 2006

(30) Foreign Application Priority Data

Jun. 28, 2002 (DE) ............................... 102 29 188

(51) Int. Cl.
*H01L 21/44* (2006.01)
(52) U.S. Cl. ............ 438/597; 257/E21.23; 257/E21.261
(58) Field of Classification Search .................. 438/597, 438/622, 243; 257/350, E21.23, 21.261
See application file for complete search history.

(56) References Cited

U.S. PATENT DOCUMENTS

| | | | | |
|---|---|---|---|---|
| 5,173,442 A * | 12/1992 | Carey | ........................... | 216/18 |
| 5,696,015 A * | 12/1997 | Hwang | ........................ | 438/253 |
| 5,922,515 A * | 7/1999 | Chiang et al. | ................ | 430/312 |
| 6,008,121 A | 12/1999 | Yang et al. | | |
| 6,103,456 A | 8/2000 | Tobben et al. | | |
| 6,127,907 A | 10/2000 | Furuya et al. | | |
| 6,130,449 A * | 10/2000 | Matsuoka et al. | ........... | 257/296 |
| 6,211,068 B1 | 4/2001 | Huang | | |
| 6,232,238 B1* | 5/2001 | Chang et al. | ................. | 438/725 |
| 6,235,628 B1 | 5/2001 | Wang et al. | | |
| 6,265,296 B1* | 7/2001 | Yen et al. | ..................... | 438/586 |
| 6,287,951 B1* | 9/2001 | Lucas et al. | .................. | 438/618 |
| 6,309,809 B1* | 10/2001 | Starikov et al. | ............. | 430/395 |
| 6,372,614 B2* | 4/2002 | Rangarajan et al. | ......... | 438/586 |
| 6,372,631 B1* | 4/2002 | Wang et al. | ................. | 438/624 |

(Continued)

FOREIGN PATENT DOCUMENTS

DE           199 37 994 A1    2/2001

(Continued)

*Primary Examiner*—Michael S. Lebentritt
*Assistant Examiner*—Thu-Juong Dinh
(74) *Attorney, Agent, or Firm*—Slater & Matsil, L.L.P.

(57) ABSTRACT

The invention relates to a method for contacting parts of a component integrated into a semiconductor substrate (1). According to the inventive method, a first contact hole is produced in an insulating layer (2), said contact hole being then filled with contact material (16) and connected to a line. The aim of the invention is to minimise the processes required for contacting parts of a component integrated into a semiconductor substrate. To this end, the hard mask (3) used to produce the contact hole is also used to structure the line.

14 Claims, 6 Drawing Sheets

U.S. PATENT DOCUMENTS

| | | | |
|---|---|---|---|
| 6,423,627 B1 * | 7/2002 | Carter et al. | 438/620 |
| 6,426,298 B1 * | 7/2002 | Chen et al. | 438/699 |
| 6,497,993 B1 * | 12/2002 | Chiu et al. | 430/313 |
| 6,521,508 B1 * | 2/2003 | Cheong et al. | 438/416 |
| 6,555,431 B1 * | 4/2003 | Xing et al. | 438/253 |
| 6,720,252 B2 * | 4/2004 | Chen et al. | 438/636 |
| 6,727,143 B1 * | 4/2004 | Hui et al. | 438/256 |
| 2001/0021552 A1 * | 9/2001 | Parekh et al. | 438/239 |
| 2001/0051408 A1 * | 12/2001 | Chih | 438/243 |
| 2001/0055730 A1 | 12/2001 | Ishibashi et al. | |
| 2002/0098676 A1 * | 7/2002 | Ning et al. | 438/622 |
| 2002/0146906 A1 | 10/2002 | Brase et al. | |
| 2004/0206722 A1 * | 10/2004 | Gruening-Von Schwerin et al. | 216/13 |

FOREIGN PATENT DOCUMENTS

| | | |
|---|---|---|
| DE | 101 08 283 A1 | 1/2002 |
| DE | 100 53 467 A1 | 5/2002 |
| DE | 101 27 888 A1 | 12/2002 |
| EP | 0 797 242 A2 | 9/1997 |
| EP | 0 908 945 A2 | 4/1999 |
| EP | 0 975 010 A1 | 1/2000 |
| JP | 11-145703 | 5/1999 |

* cited by examiner

METHOD FOR CONTACTING PARTS OF A COMPONENT INTEGRATED INTO A SEMICONDUCTOR SUBSTRATE

The invention relates to a method for fabricating contacts for parts of a component integrated into a semiconductor substrate, in which the semiconductor substrate is provided with an insulating layer, in which a first contact is to be formed by means of a first contact hole, which is filled with a contact material, the insulating layer is provided with a resin mask, in which an opening to the insulating layer is created for forming the first contact hole, the first contact hole is etched up to the first surface to be contacted, the first contact hole is filled with a contact material, and a first conductor connected to the contact material is created in a conduction plane.

Components integrated into a semiconductor substrate have regions that must be contacted for connecting to other components.

As described, e.g., in DE 100 53 467 A1, the contacts are formed by means of contact holes, which are filled with a conductive material. This conductive material is then connected again on its side to one or more conduction planes.

If the component is a semiconductor component, e.g., a DRAM memory cell, then this component has a layer stack arranged on the semiconductor substrate as the gate of the cell transistor, comprising the gate electrode and the gate dielectric insulating the gate electrode from the semiconductor substrate. In addition to this layer stack, the source/drain regions lie in the semiconductor substrate.

A contact to the layer stack (CG contact) operating as the gate is used for connecting to word lines, which are formed in later processing steps. For forming contacts to the layer stack, it is necessary to remove a first insulating layer, which is composed of, e.g., nitride, located on the layer stack, in the region of the contacts. Such an insulating layer is composed of, e.g., nitride.

Furthermore, it is necessary to contact the substrate surface in the region of the source/drain regions and to provide a contact at this point, which is used for connecting to a bit line (CB contact). A contact to other diffusion regions (CD contact) is also provided, which likewise contacts the substrate surface.

As described in German Patent Application 101 27 888.8, the fabrication of the contacts is realized by means of a resin mask, e.g., composed of polycrystalline silicon, which is structured on its side via a photolithographic mask. In this way, at first an insulating layer, e.g., as a TEOS layer, which is used for insulating the conductor structure subsequently constructed on this layer from the semiconductor component and the conductor, one under the other, is deposited onto the top side of the semiconductor substrate. Then a resin mask, which already contains the openings for the contact holes to be formed, is deposited onto this insulating layer.

As described in DE 100 53 467 A1, a resin mask can be realized such that the material of the resin mask is first deposited as a continuous layer. For structuring this resin mask layer, a photoresist layer is deposited onto this continuous layer, which is exposed to light such that it exposes the regions of the resin mask layer to be used for forming the contact holes. Then, through an etching process, those regions that expose the insulating layer are formed.

Then an etching process is performed selectively to the nitride layer and opens all of the regions of the substrate surface not covered by a nitride layer. In this way, contact holes for the CB and the CD contact are formed.

In another lithographic step, the contact holes for the CB and the CD contact are filled and covered with photoresist. The mask for the contact hole of the CG contact is open. Thus, with another etching step, the insulating layer, for example, the nitride layer, can be removed from the gate, i.e., the layer stack.

After the end of their structuring, the contact holes are provided with a liner for chemical separation, and filled with conductive material, e.g., tungsten. Then the conductive material on the top side, the liner lying underneath, and the resin mask are removed again. This can be performed through either a dry etching process or a wet etching process, or through a CMP process (chemical-mechanical polishing process). Then other conduction planes can be fabricated using another resin mask. Here, there is the disadvantage that an additional etching step is necessary for removing the resin mask.

The problem of the invention is to minimize the processing expense for forming contacts for parts of a component integrated into a semiconductor substrate.

The problem is solved in that before the contact hole is filled with contact material, the following steps are performed:

The first contact hole is filled with an ARC material (ARC=anti-reflection coating) and the surface of the resin mask is provided with an ARC layer.

On the ARC layer, a photoresist mask with the structure of the conductor is deposited.

The parts of the ARC layer not covered by the photoresist mask are removed together with the parts of the resin mask located partially underneath this layer.

The parts of the insulating layer not covered by the photoresist mask are removed as conductor trenches up to the level of the conduction plane.

The ARC filling is removed in the first contact hole.

Then the first contact hole is filled together with the conductor trenches with contact material. Finally, the contact material and the resin mask are removed at least up to the surface of the insulating layer.

Through this method, it is possible to use the resin mask not only for the structuring of the first contact hole, but also for the structuring of the conductor. Thus, one step, which is required according to the state of the art, for removing the resin mask is eliminated.

Further simplification to the processing is achieved in that the photoresist mask is removed together with the ARC filling.

Another possibility for removal is to remove the photoresist mask immediately after the structuring of the resin mask with the structure of the conductor.

A third possibility is to remove the photoresist mask together with or immediately before the resin mask.

It is preferable that a mask made from polycrystalline silicon be used as the resin mask. This material can be realized in the processing with at most minimal expense.

In a favorable configuration of the method according to the invention, the resin mask is structured by a diagonal etching profile.

On one side, this diagonal etching profile can be used for the structuring of the contact hole. Thus, the contact hole dimensions can be reduced relative to a straight etching profile, because the "slope angle" of the resin mask on the side on which the resin mask contacts the insulating layer exhibits a line offset relative to the top edge.

On the other hand, it is possible to use the diagonal etching profile from the same slope angle function for setting a minimal conductor width. Reducing the conductor width is normally possible only with expensive lithography or an expensive processing structure, e.g., by using a tungsten RIE conductor instead of the classical tungsten dual damascene conductor. Through the use of a diagonal etching profile, on the one hand, a narrow conductor can be achieved with simple technical means. On the other hand, a narrower conductor reduces the conductor capacitance, and thus ultimately improves the parameters of the semiconductor component.

A favorable variant for structuring the resin mask is to structure the resin mask by means of a dry etching process.

In the dry etching process, the gases $SF_6$, HBr, or $He/O_2$ can be used. A straight or diagonal etching profile is used according to the etching gas.

To avoid chemical effects between the different materials, it is preferable to deposit a liner onto the surfaces to come in contact with the contact material before introducing the contact material.

Ti or Ti/TiN represents a favorable material for such a liner.

Preferably, tungsten can be used as the contact material.

In another configuration of the method, the contact material and the resin mask are realized via a CMP process (chemical-mechanical polishing process).

Normally, in a semiconductor component, several regions contact the semiconductor substrates for example, the source and drain in a MOS transistor. For this reason, a second contact hole, up to a second contact surface, to be contacted is formed in a similar way together with the first contact hole.

This first contact hole can then be used for an outer electrical connection in two possibilities. First, a second conductor, which is insulated from the first conductor and which is connected to the contact material in the second contact hole, is formed in the insulating layer.

Second, the contact material of the second contact hole can be connected in another conduction plane to a second conductor.

Especially for forming the contacts of transistors and cell transistors in memory cells, it is necessary to contact the gate of the transistor. Gates are usually composed of a stack of several layers. Thus, one configuration of the method is characterized in that a layer stack, at least composed of a gate oxide and a cover, is deposited onto the surface of the substrate. For forming contacts to the gate oxide, a third contact hole is formed for the gate oxide, such that the first, or the first and the second, contact hole is selectively etched up to the cover and filled and covered after their formation with an auxiliary material. Then the cover is etched up to the gate oxide and the auxiliary material is removed. Then the same method is performed for the third contact hole as for the first or the first and the second contact hole starting with the filling and coating with ARC material.

For the third contact hole, there are also two possibilities for a connection to the outside.

First, a third conductor, which is insulated from the first conductor or from the first and the second conductor and which is connected to the contact material in the third contact hole, is formed in the insulating layer.

Second, it is possible to connect the contact material of the third contact hole in another conduction plane with a third conductor.

It is especially preferable that the auxiliary material be composed from photoresist.

In this way, it can be an advantage to deposit an ARC layer under the photoresist in order to simplify the removal of the photoresist.

The invention will be explained in more detail in the following with reference to an embodiment.

The figures represent progressive processing steps and are described in the following in the sequence of FIGS. 1 to 11.

Figure 1:
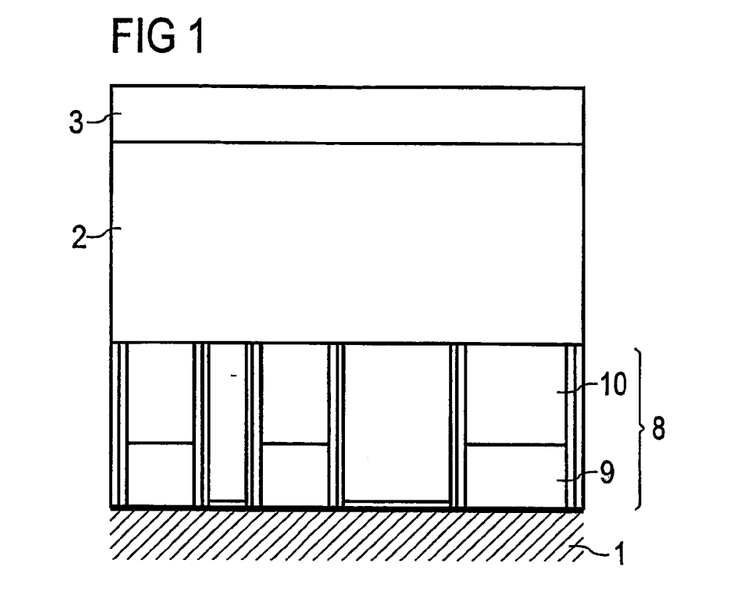
FIG. 1, a cross section through a semiconductor substrate after coating with the insulating layer and the resin mask, FIG. 2, a cross section through a semiconductor substrate after exposure and development of a first photoresist mask, FIG. 3, a cross section through a semiconductor substrate after the first structuring of the resin mask, FIG. 4, a cross section through a semiconductor substrate after an etching step for fabricating a first and second contact hole, FIG. 5, a cross section through a semiconductor substrate after exposure with an auxiliary layer, FIG. 6, a cross section through a semiconductor substrate after completion of the third contact hole, FIG. 7, a cross section through a semiconductor substrate after ARC exposure and with a structured second photoresist mask, FIG. 8, a cross section through a semiconductor substrate after the structuring of the second photoresist mask, FIG. 9, a cross section through a semiconductor substrate after etching of the insulating layer up to the conduction plane, FIG. 10, a cross section through a semiconductor substrate after filling with contact material, and FIG. 11, a cross section through a semiconductor substrate after removal of the contact material and the resin mask up to the top side of the insulating layer.

First, an insulating layer 2 is deposited onto the semiconductor substrate 1 in the form of a TEOS layer. A resin mask 3 made from polycrystalline silicon is deposited onto this layer.

Figure 2:
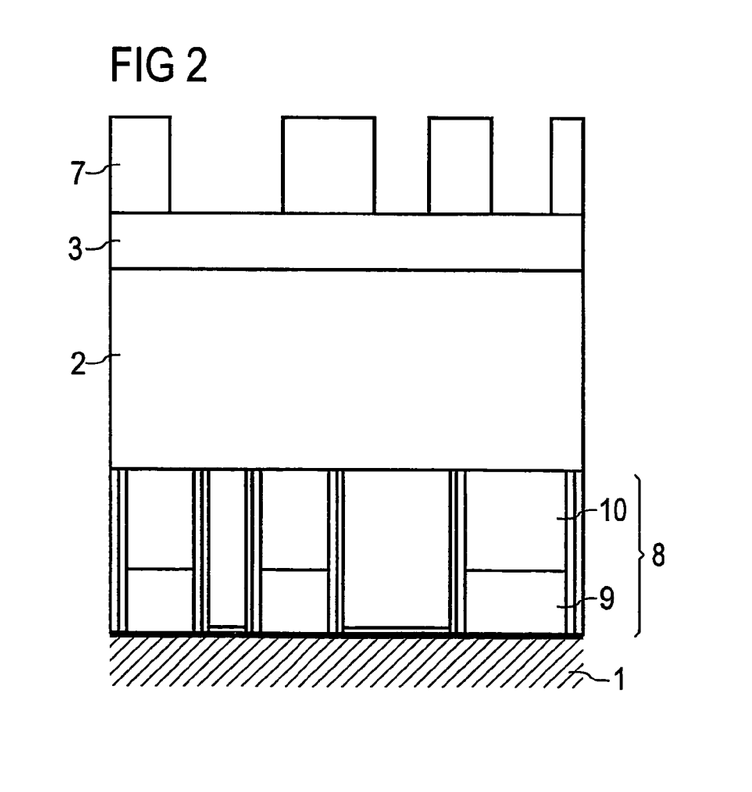
Figure 3:
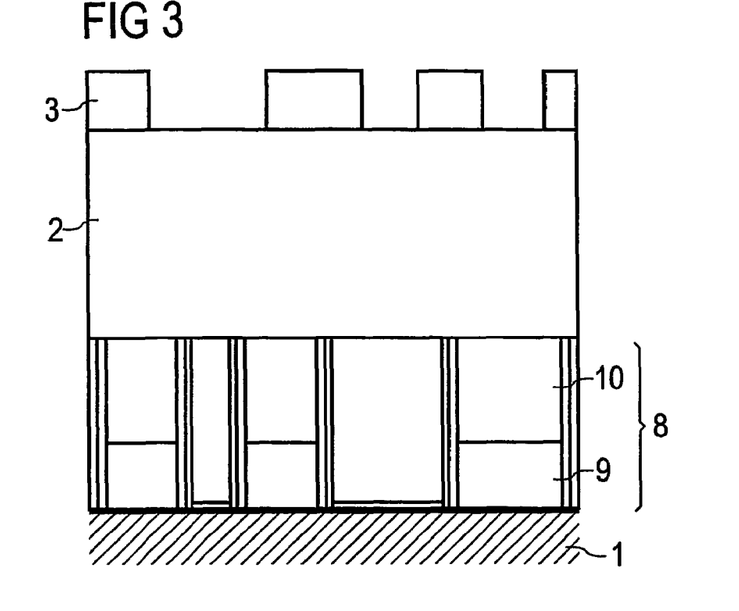

As shown in FIG. 2, CT lithography (contact-to-transistor lithography) is then performed, i.e., in this lithographic step, the first contact hole 4 for the CB contact, the second contact hole 5 for the CD contact, and the third contact hole 6 for the CG contact are formed. For this purpose, first a first photoresist mask 7 is exposed to light. After the lacquer develops, which is shown in FIG. 3, the resin mask 3 is opened by means of a dry etching process, wherein the gases $SF_6$, HBr, $Cl_2$, and/or $He/O_2$ can be used. Especially through these etching gases or etching gas combinations, the otherwise necessary etching processes specific to the insulating layer 2 lying underneath is ensured.

According to the dry etching process that is applied, either a straight or a diagonal etching profile can be set for the resin mask 3. The contact hole dimensions can be reduced with the aid of the diagonal etching profile. A different or additional possibility for reducing the contact hole dimensions is to introduce an ARC layer, which is not shown in more detail, between the first photoresist mask 7 and the resin mask 3. The thickness of this ARC layer can lie on the order of magnitude of the thickness of the resin mask 3. After etching this ARC layer, the etching of the resin mask 3 is then performed. This etching step must be performed again, specific to the insulating layer 2. Here, it is also possible with the use of a corresponding etching chemical reaction to etch the ARC layer diagonally. The diagonal etching edges, a so-called taper, reduce the exposed region of the insulating layer 2, which similarly achieves a reduction of the contact hole structures, as described above.

Figure 4:
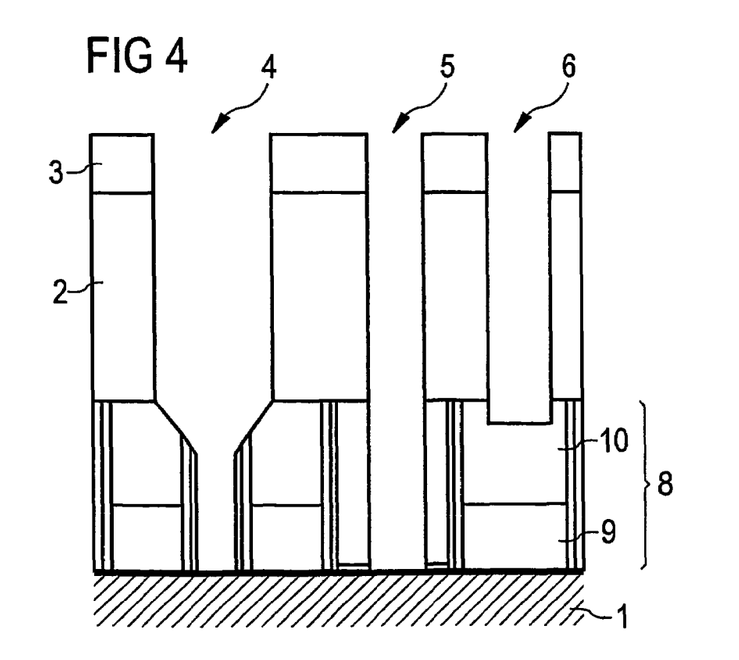

Then the photoresist mask 7 is removed. Now, the CT etching (contact-to-transistor etching) can be performed without negative effects to the photoresist mask 7, as shown in FIG. 4.

Figure 5:
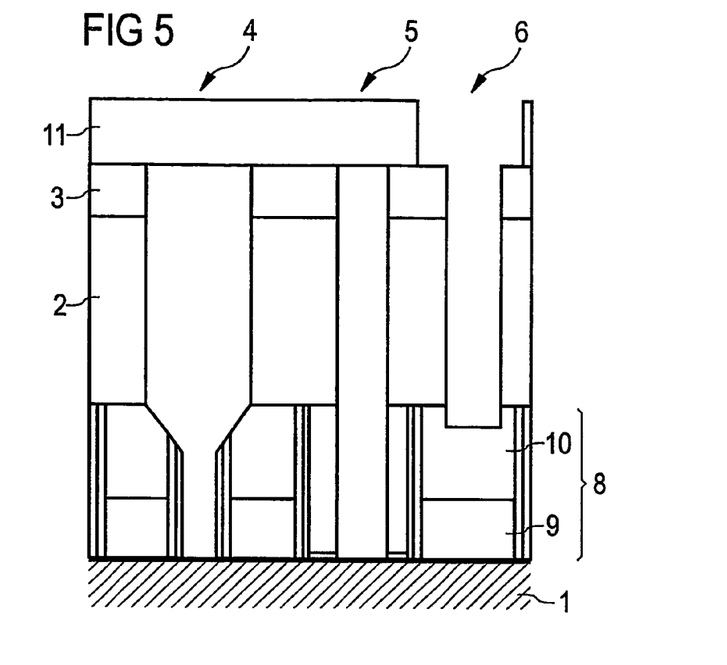
Figure 6:
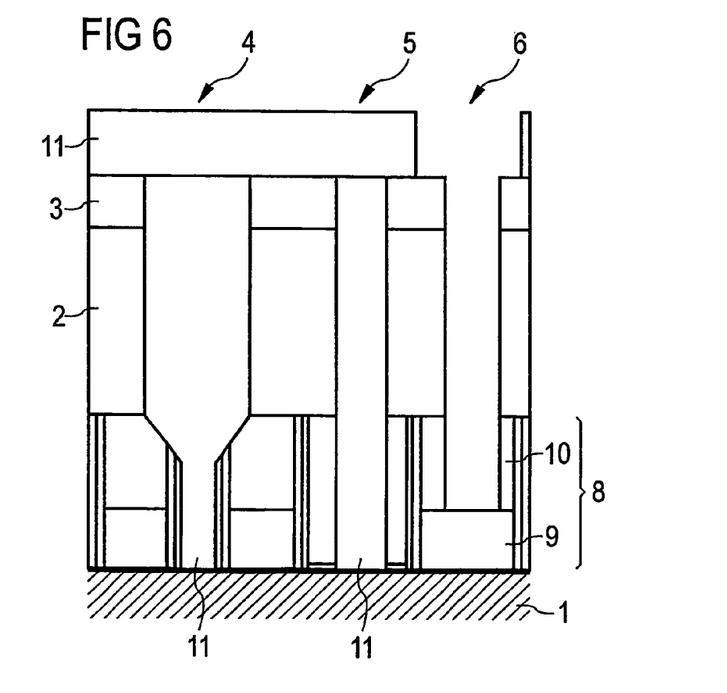

The third contact hole 6 is used for fabricating the CG contact. The gate 8 is composed of a layer stack made from a gate oxide 9 and a nitride cap 10 arranged on this gate oxide. Because the CT etching is first performed selectively with respect to the nitride, only the first 4 and second contact holes 5 are opened. Then the CG lithography (contact-to-gate lithography) is performed. Here, the first 4 and the second contact holes 5 are filled and covered after their formation with an auxiliary material 11, which is formed by a photoresist lacquer. With the aid of an etching process, unselectively with respect to nitride, the nitride cap 10 is etched up to the gate oxide 9, and thus the third contact hole 6 is opened up to the gate oxide 9. This is shown in FIG. 6.

Figure 7:
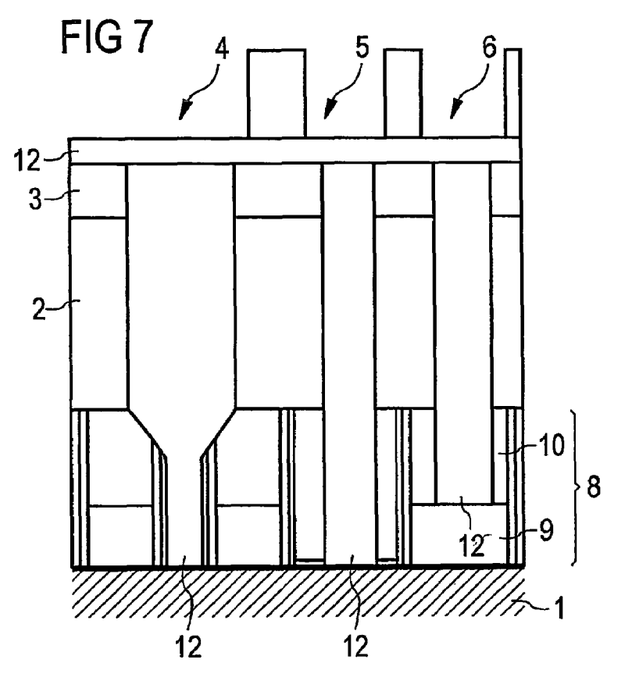
Figure 8:
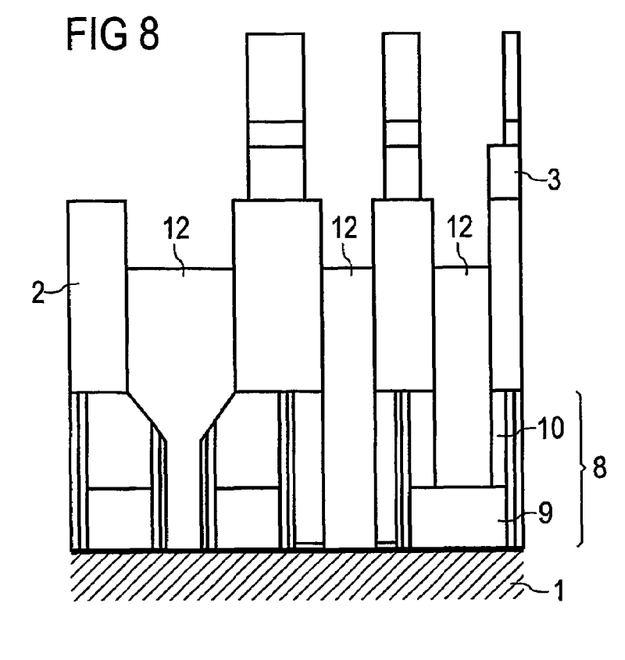

After the photoresist lacquer 11 as the auxiliary material has been removed, the first, second, and third contact holes 4, 5, and 6 are filled and covered with an ARC material 12. Then a second photoresist mask 13 with the structure of the conductors to be fabricated is formed on the surface of the ARC material 12. Then the resin mask 3 is structured with the second photoresist mask 13, reference number 13 not shown. Here, the layer made from ARC material 12 is initially opened with a dry etching process. To prevent the possibility of so-called "fence" formation, a recess-processing step can also be performed with the ARC material 12.

Figure 9:
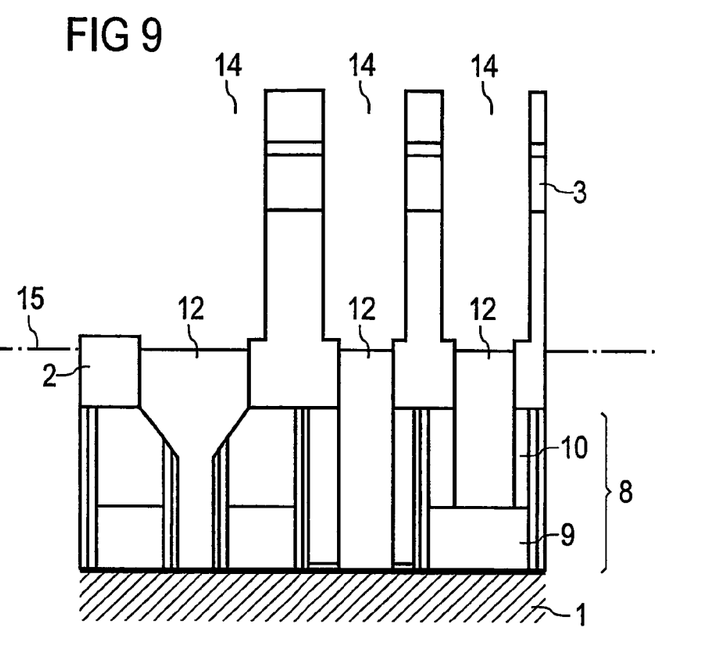

With a suitable dry etching process for the polycrystalline resin mask 3, e.g., under the use of a $SF_6$-based chemical reaction, etching profiles can be realized in the resin mask 3. According to the etching process and thickness of the resin mask 3, different positive angles can be set in the etching profile. In this way, the width of the conductors to be formed can be considerably narrower. In this way, the etching of the conductor width, which is reduced relative to the standard process (without resin mask), is performed. This is shown in FIG. 9, although without the diagonal etching profile.

Another possibility for reducing the conductor width is to create diagonal edges, thus again a taper, with the ARC material 12 in a way not described in more detail for the etching of the layer made from ARC material 12 with a suitable etching material, by means of which a smaller width of the conductor trench 14 and thus the conductor to be fabricated is achieved.

With the second photoresist mask, conductor trenches 14 are then etched up to a conduction plane 15.

The second photoresist mask 13 is again removed after the structuring of the conductor trenches 14. During this etching, the nitride cap 10 of the layer stack of the gate 8 is protected by the ARC material 12.

Figure 10:
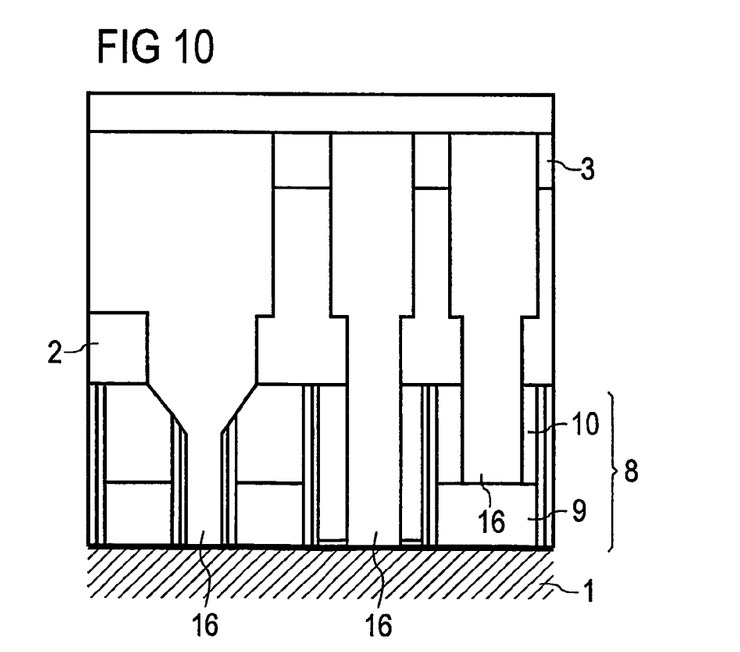

After the conductor trenches 14 have been formed, a liner made from TiN or Ti/TiN is deposited and then filled with contact material 16 made from tungsten, as shown in FIG. 10.

Figure 11:
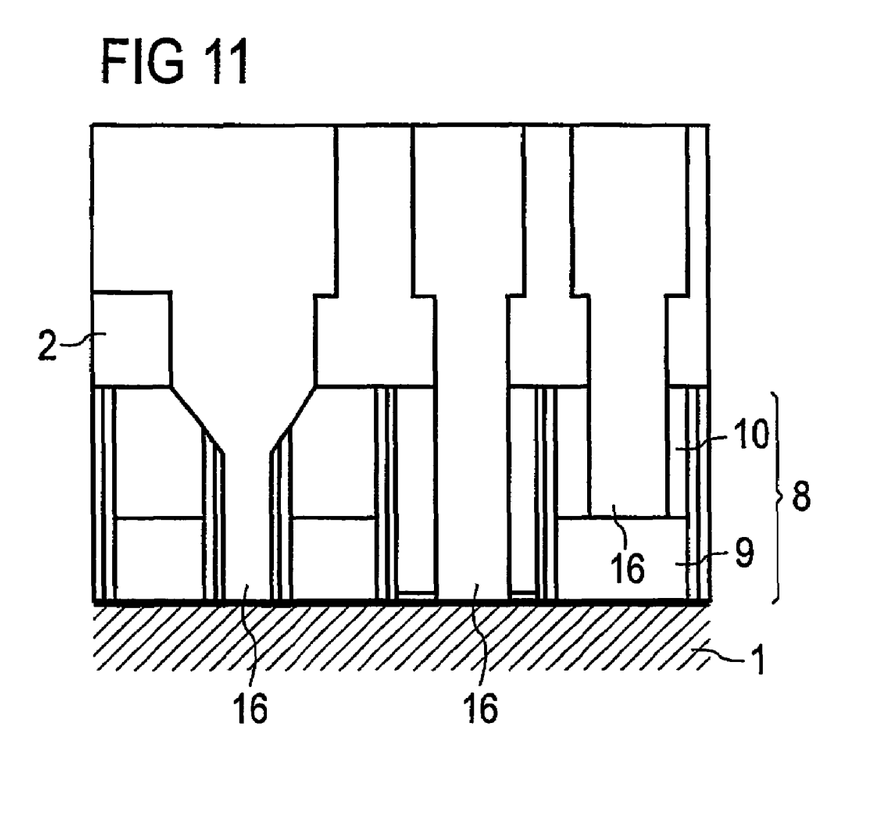

As shown in FIG. 11, a tungsten CMP process follows, which essentially consists of two partial steps. First the classic tungsten CMP process is performed. Then the resin mask CMP processing step, which removes the resin mask 3, is performed. For this type of resin mask removal, no additional processing step is necessary; instead, the removal is performed within the standard CMP process.

LIST OF REFERENCE SYMBOLS

1 Semiconductor substrate
2 Insulating layer
3 Resin mask
4 First contact hole
5 Second contact hole
6 Third contact hole
7 First photoresist mask
8 Gate
9 Gate oxide
10 Nitride cap
11 Photoresist lacquer as auxiliary material
12 ARC material
13 Second photoresist mask
14 Conductor trench
15 Conduction plane
16 Contact material

The invention claimed is:

1. A method of forming electrically connected contacting parts of a component integrated into a semiconductor substrate, the method comprising:
    providing a hard mask patterned over an insulating layer to define a contact hole; forming said contact hole in said insulating layer; filling the contact hole with an ARC layer that also overlies said patterned hard mask and the insulating layer; depositing and patterning a photoresist layer on said ARC layer; removing portions of the ARC layer and portions of the hard mask not covered by the photoresist layer to repattern said hard mask to define a conductive line trench; removing portions of the insulating layer to form said conductive line trench; removing the ARC layer from the contact hole; and filling the contact hole and said conductive line trench with contact material so that the filled contact hole and the conductive line trench are electrically connected.

2. The method of claim 1 wherein said hard mask is made from polycrystalline silicon.

3. The method of claim 1 further comprising patterning said hard mask by means of a dry etching process.

4. The method of claim 3 wherein said dry etching process comprises using at least one of the group $SF_6$, HBr and $He/O_2$.

5. The method of claim 1 further comprising depositing a liner on a surface of said contact hole and conductive line trench prior to said step of filling with contact material.

6. The method of claim 5 wherein said liner is selected from the group consisting of Ti and TiN.

7. The method of claim 1 wherein said step of filling the contact hole and the conductive line trench comprises filling with tungsten.

8. A method of forming a contact hole and a conductor trench connecting to said contact hole in an insulating layer using a common hard mask, the method comprising:
    providing said insulating layer;
    providing said hard mask, said hard mask patterned to form said contact hole;
    etching said contact hole in said insulating layer;
    covering said insulating layer with an ARC layer to fill said contact hole;
    re-patterning said hard mask subsequent to said step of covering said insulating layer with said ARC layer to define said conductor trench connected to said contact hole;
    etching said conductor trench in said insulating layer according to said re-patterned hard mask; and
    filling said contact hole and said conductor trench with a conductive material such that said conductive material in said conductor trench and said contact hole are electrically connected.

9. The method of claim 8 wherein said hard mask is made from polycrystalline silicon.

10. The method of claim 8 wherein said step of re-patterning said hard mask comprises etching said hard mask by means of a dry etching process.

11. The method of claim 10 wherein said dry etching process comprises using at least one of the group $SF_6$, HBr and $He/O_2$.

12. The method of claim 8 further comprising a step of depositing a liner on a surface of said contact hole and conductor trench prior to said step of filling.

13. The method of claim 8 wherein said step of filling said contact hole and conductor trench with conductive material comprises filling said contact hole and conductor trench with tungsten.

14. The method of claim 12 wherein said liner is selected from the group consisting of Ti and TiN.

* * * * *